(12) United States Patent
Jalla

(10) Patent No.: US 11,675,813 B2
(45) Date of Patent: Jun. 13, 2023

(54) METHOD AND SYSTEM FOR IDENTIFYING CONFLICTS BETWEEN A BUILDING'S FRAME STRUCTURE AND FURNITURE

(71) Applicant: Consulting Engineers, Corp., Reston, VA (US)

(72) Inventor: Maharaj Jalla, Great Falls, VA (US)

( * ) Notice: Subject to any disclaimer, the term of this patent is extended or adjusted under 35 U.S.C. 154(b) by 516 days.

(21) Appl. No.: 16/820,866

(22) Filed: Mar. 17, 2020

(65) Prior Publication Data
US 2021/0141808 A1 May 13, 2021

Related U.S. Application Data

(63) Continuation of application No. 16/677,639, filed on Nov. 7, 2019, now Pat. No. 11,113,310.

(51) Int. Cl.
| | |
|---|---|
| *G06F 30/13* | (2020.01) |
| *G06F 16/27* | (2019.01) |
| *G06F 16/23* | (2019.01) |
| *G06Q 50/16* | (2012.01) |
| *G06T 19/20* | (2011.01) |

(52) U.S. Cl.
CPC ........ *G06F 16/273* (2019.01); *G06F 16/2329* (2019.01); *G06F 16/2365* (2019.01); *G06F 30/13* (2020.01); *G06Q 50/165* (2013.01); *G06T 19/20* (2013.01); *G06T 2219/2004* (2013.01)

(58) Field of Classification Search
CPC ............... G06F 16/273; G06F 16/2329; G06F 16/2365; G06F 30/13; G06Q 50/165; G06T 19/20; G06T 2219/2004
See application file for complete search history.

(56) References Cited

U.S. PATENT DOCUMENTS

| | | | |
|---|---|---|---|
| 2008/0059220 A1* | 3/2008 | Roth | G06Q 50/18 705/317 |
| 2010/0024318 A1* | 2/2010 | Zhang | G06F 30/13 52/79.5 |

OTHER PUBLICATIONS

Peng, Gaoliang, et al. "A desktop virtual reality-based interactive modular fixture configuration design system." Computer-Aided Design 42.5 (2010): 432-444. (Year: 2010).*

* cited by examiner

*Primary Examiner* — Chuen-Meei Gan
(74) *Attorney, Agent, or Firm* — Andrew Morabito

(57) ABSTRACT

The present invention is a computer implemented method for determining and conforming the position of furniture within a building, comprising: accessing, by at least one processor, a model; identifying, by at least one processor, components and frame members, wherein the components are positioned within the model and interface with select frame members; detecting, by at least one processor, at least one instance where the component interfaces with at least one of the frame members; calculating, by at least one processor, an actual location of the component relative to the frame members; comparing, by at least one processor, the actual location of the component relative to the frame members to a required location; and generating, by at least one processor, a list of interfaces which the actual location is outside the predetermined range of the required locations.

17 Claims, 12 Drawing Sheets

METHOD AND SYSTEM FOR IDENTIFYING CONFLICTS BETWEEN A BUILDING'S FRAME STRUCTURE AND FURNITURE

CROSS-REFERENCE TO RELATED APPLICATIONS

This application is a continuation-in-part (and claims the benefit of priority under 35 USC 120) of U.S. Pat. No. 1,113,310 issues on Sep. 7, 2021. The disclosure of the U.S. Pat. No. 1,113,310 is considered part of (and is incorporated by reference in) the disclosure of this application.

BACKGROUND

This disclosure relates generally to building construction and in particular, to the method, computer program, or computer system for providing the quality control of the material for the building construction and determining conflicts within the building construction.

The construction of a building requires the incorporation of multiple different systems at different stages of the construction process. Typically, a frame is constructed, the plumbing, electric, and mechanical systems are installed. The finishing materials are installed, and then the appliances and fixtures are secured in place. These systems are usually completed independently of one another, usually by different workers. This creates problems where different styles and strategies can conflict and cause interferences between the different systems. Alterations may need to be made to parts to allow other parts to pass through or fit correctly. These alterations may results affect the structural integrity of different parts, result in lost time, or the need to further modify various systems and parts. If each part is not the correct specification or dimensions or position then it leads to conflicts in the assembly process. This results in loss of time, wasted material, and an increase in cost. For example, when constructing frames, conflicts between the members can occur in overlapping of the members, wrong placing of dimples locations, insufficient overlap length, incorrect aperture or cutout locations and overlap width. Checking each individual member and panel is very time consuming and critical task for the engineer.

During the building construction, the connections and placing of frame member is important for a hassle and conflict free construction. The proper placement of each frame member is important for both creating a strong and sturdy frame, but also for the inclusion of all sub-systems within the building.

Building construction is a complicated process in which multiple disciplines are involved in the overall process. Within the building frame are a vast number of sub-systems, such as the plumbing, drainage pipes, drainage fixtures, sewage pipes, and the like, electrical systems, HVAC, heating, ventilation, and in recent times renewable energy systems such as solar panels and the like are installed. Within the rooms and open space are the fixtures, furniture, appliances, and other aspects of the building which the occupants live and work in.

Typically, when a building is being designed the location of these sub-systems is estimated and the frame members are modified or adjusted on site to accommodate them. This creates potential issues with both affecting the structural integrity of the frame members and the lose time to modify, adjust, or replace these members if the sub-system cannot be easily integrated into or around the frame.

Therefore, it is beneficial to assist each of the frame members which interact or intersect with the furniture are manufactured to accommodate the furniture at the earliest stage to determine where issues exist and preemptively correcting these issues before construction begins.

SUMMARY

In a first embodiment, the present invention is a computer implemented method for determining and conforming the position of furniture within a building, comprising: accessing, by at least one processor, a model, wherein the model is comprised of frame members; identifying, by at least one processor, components and frame members, wherein the components are positioned within the model and interface with frame members, wherein the components interface with a set of frame members associated with a floor and a set of frame members associated with a wall; analyzing, by at least one processor, at least one instance where the component interfaces with at least one of the frame members; calculating, by at least one processor, an actual location of the component relative to the frame members; comparing, by at least one processor, the actual location of the component relative to the frame members to a required location; generating, by at least one processor, a list of interfaces which the actual location is outside the predetermined range of the required locations; and manipulating, by at least one processors, the actual location of the component relative to the frame members.

In a second embodiment, the present invention is a computer program product, comprising: a computer readable non-transitory storage medium having program instructions embodied therewith, the program instructions executable by a computing device to cause the computing device to: program instructions to access a model, wherein the model is comprised of frame members; program instructions to identify components and frame members, wherein the components are positioned within the model and interface with frame members, wherein the components interface with a set of frame members associated with a floor and a set of frame members associated with a wall; program instructions to analyze at least one instance where the component interfaces with at least one of the frame members; program instructions to calculate an actual location of the component relative to the frame members; program instructions to compare the actual location of the component relative to the frame members to a required location; program instructions to generate a list of interfaces which the actual location is outside the predetermined range of the required locations; and program instructions to manipulate the actual location of the component relative to the frame members. The computer program product of claim 8, further comprising, program instructions to detect a set of fastening locations for the sheathing material.

In a third embodiment, the present invention is a system comprising: a CPU, a computer readable memory and a computer readable non-transitory storage medium associated with a computing device; program instructions to access a model, wherein the model is comprised of frame members; program instructions to identify components and frame members, wherein the components are positioned within the model and interface with frame members, wherein the components interface with a set of frame members associated with a floor and a set of frame members associated with a wall; program instructions to analyze at least one instance where the component interfaces with at least one of the frame members; program instructions to calculate an actual location of the component relative to the frame members; program instructions to compare the actual location of the component relative to the frame members to a required location; program instructions to generate a list of interfaces which the actual location is outside the predetermined range of the required locations; and program instructions to manipulate the actual location of the component relative to the frame members.

DETAILED DESCRIPTION

Figure 1:
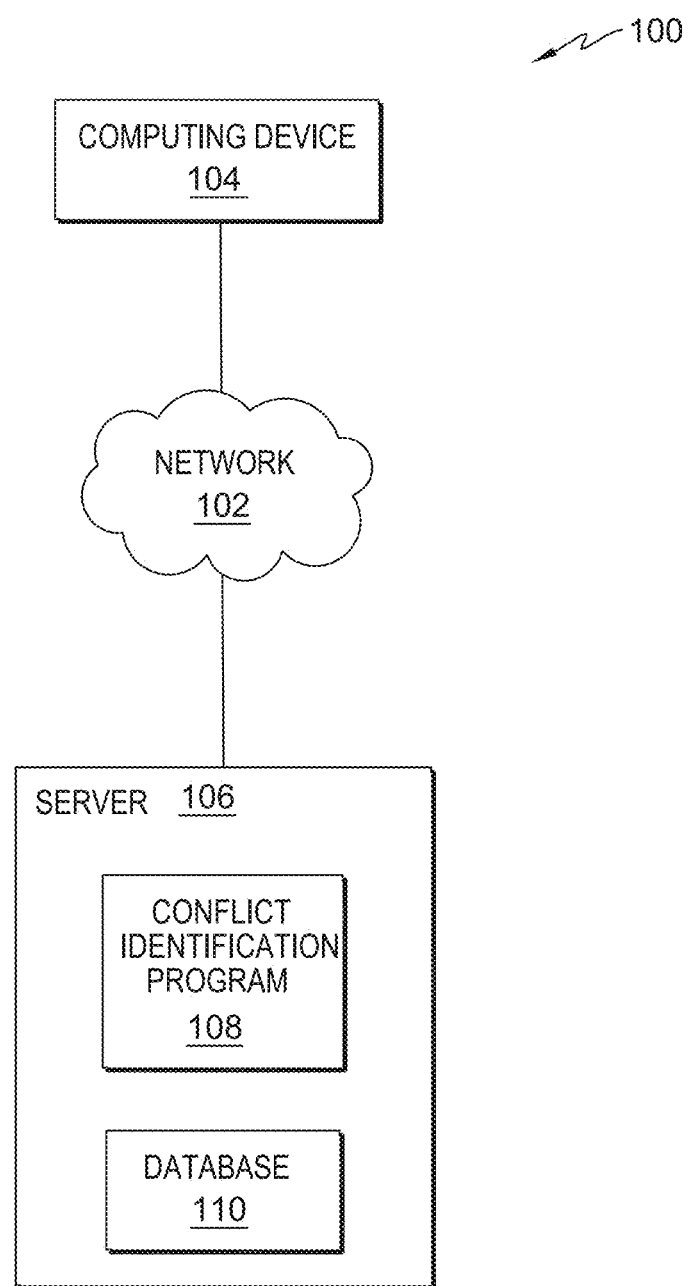
FIG. 1 depicts a block diagram depicting a computing environment, in accordance with one embodiment of the present invention.

The present invention generally relates to the process of analyzing a building to identify conflicts or design errors, and correcting the errors at the design stage so the construction can be completed with minimal or no issues. In a typical building the furniture is placed within the livable space. The furniture may be bedroom furniture, living room furniture, dining room furniture both movable and fixed in place Due to the furniture needing to be secured in place in some instances, the placement of the frame members is important so that when the furniture are installed they are secured properly and safely.

The present invention provides several advantages to design and analysis of the furniture integration into the building design. Through the use of cold formed steel members and the manufacturing process permitting a customizable generation of each frame member. When a 3D model is generated of the frame, and the furniture is integrated into the frame to determine and detect all intersection and interfaces between the frame, the sheathing material, and the furniture (e.g. conflicts). The system is then able to determine a theoretical solution to the conflict by modifying the member(s) or the furniture(s). This results in the cold form steel members which are manufactured to have the needed cutouts, notches, or alterations to accommodate the furniture, and the specifics of the furniture are known to confirm a near perfect fit. Thus, reducing time wasted modifying the frame members, the furniture, and potentially diminishing the structural integrity of the members or furniture.

In the typical construction process a model of the building (e.g. structure, home, office building, hospital, garage, barn, apartment building, etc.) is created. This model is comprised of all the members which form the frame of the building. The members form assemblies (e.g. panels, joists, trusses, etc.) which them form the walls, floors, and roof. The next step is to generate the manufacturing files for the roll forming machine to produce these members to the design specifications. However, the generation of these manufacturing files is not advised or able to be completed until a verification of possible conflicts of the wall systems is completed.

Otherwise the potential for cold formed steel members will be manufactured without the proper measurements, cutouts or designs elements. This will require the remanufacturing of the members, or manual modification of the parts need to be completed on the job site. Both of these take time and additional resources to complete. The reviewing of the model from constructability aspect and identify the possible conflicts is a time consuming task before the frame members and assemblies are manufactured. If the user is able to quickly identify the conflicts in the model, the entire process of constructing the building can be shortened.

The reviewing of the 3D model from constructability aspect and identify the possible conflicts in the walls, floors, or ceilings is one of the major time consuming task. If the user is able to quickly check and identify the possible conflicts, they can increase the speed of manufacturing, and having a program that highlights these conflicts only further increases the speed at which the project can be completed.

The present invention provides for an advantage of allowing the review of the drawings or models by providing a unique process of identifying conflicts between the frame members and the furniture The individual members of the frame which are conflicting are identified and marked for the reviewer to easily identify and correct the conflicts. The conflicts can be identified during the process of building detailing by using the present inventions conflict check method and system.

The term "conflict" is used for any incidence which results in the member or the interaction between members to be outside of a predetermined tolerance of acceptable values. This can be based on state, federal or local building codes, manufacturing machine limitations, or inconsistencies or inaccuracies with the model or drawings. For example, if a member is not at the required position, not within the required specifications, not adhering to predetermined codes, or the like a conflict may be present. Required position means the Global position of the member in reference to the modeling software x, y, and z, axes. In another embodiment, the properties of the member may be impossible to manufacture based on the cold formed steel construction tolling operation limitations The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or mechanical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firejoists, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowcharts and block diagrams in the Figures illustrate the architecture, functionality, and operation of possible implementations of systems, methods, and computer program products according to various embodiments of the present invention. In this regard, each block in the flowcharts may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the flowchart illustrations, and combinations of blocks in the flowchart illustrations, can be implemented by special purpose hardware-based systems that perform the specified functions or acts or carry out combinations of special purpose hardware and computer instructions.

It is understood in advance that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g. networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firejoists).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure comprising a network of interconnected nodes.

FIG. 1 depicts a block diagram of a computing environment 100 in accordance with one embodiment of the present invention. FIG. 1 provides an illustration of one embodiment and does not imply any limitations regarding the environment in which different embodiments maybe implemented.

In the depicted embodiment, computing environment 100 includes network 102, computing device 104, and server 106. Computing environment 100 may include additional servers, computers, or other devices not shown.

Network 102 may be a local area network (LAN), a wide area network (WAN) such as the Internet, any combination thereof, or any combination of connections and protocols that can support communications between computing device 104 and server 106 in accordance with embodiments of the invention. Network 102 may include wired, wireless, or fiber optic connections.

Computing device 104 may be a management server, a web server, or any other electronic device or computing system capable of processing program instructions and receiving and sending data. In other embodiments, computing device 104 may be a laptop computer, tablet computer, netbook computer, personal computer (PC), a desktop computer, or any programmable electronic device capable of communicating with patient computing device 104 via network 102. In other embodiments, computing device 104 may be a server computing system utilizing multiple computers as a server system, such as in a cloud computing environment. In one embodiment, computing device 104 represents a computing system utilizing clustered computers and components to act as a single pool of seamless resources. Computing device 104 may include components, as depicted and described in further detail with respect to FIG. 1.

Server 106 may be a management server, a web server, or any other electronic device or computing system capable of processing program instructions and receiving and sending data. In other embodiments server 106 may be a laptop computer, tablet computer, notebook computer, personal computer (PC), a desktop computer, or any programmable electronic device capable of communicating via network 102. In one embodiment, server 106 may be a server computing system utilizing multiple computers as a server system, such as in a cloud computing environment. In one embodiment, server 106 represents a computing system utilizing clustered computers and components to act as a single pool of seamless resources. In the depicted embodiment conflict identification program 108 and database 110 are located on server 106. Server 106 may include components, as depicted and described in further detail with respect to FIG. 1.

Conflict identification program 108 has the unique feature of 3-Directional constructability conflict check in which the plumbing system is analyzed to determine where conflicts are present between the plumbing system and the frame members. The conflicts may be present where the plumbing system furniture interface or interact with the frame members. The frame members and plumbing furniture which are conflicting with each other are added to a list ("sick list") which identifies all of the conflicting members and/or furniture and the cause of the conflict. The cause of the conflict could be overlapping, inadequate spacing between the members and furniture, or a design which is not possible to manufacture (e.g. a cutout in a member that the machine cannot create due to limitations of the machine). The conflict may also be between any material, component, member or the like which cannot be properly installed due to other material, furniture, or members which either interfere with one another or are not within the proper code requirements. The sick list shows the condition under which the member(s) or furniture(s) are conflicting in constructability conflict check, so personnel can easily make the necessary modifications to correct the conflicts and produce a model of the building without any conflicts.

In the depicted embodiment, Conflict identification program 108 utilizes network 102 to access the computing device 104 and to communicate with database 110. In one embodiment, Conflict identification program 108 resides on computing device 104. In other embodiments, Conflict identification program 108 may be located on another server or computing device, provided Conflict identification program 108 has access to database 110.

Database 110 may be a repository that may be written to and/or read by Conflict identification program 108. Information gathered from computing device 104 and the 1-dimensional, 2-dimensional, and 3-dimensional drawings and models as well as the requirements so that the materials and members are identified as conflicting or non-conflicting. In one embodiment, database 110 is a database management system (DBMS) used to allow the definition, creation, querying, update, and administration of a database(s). In the depicted embodiment, database 110 resides on computing device 104. In other embodiments, database 110 resides on another server, or another computing device, provided that database 110 is accessible to Conflict identification program 108.

Figure 2:
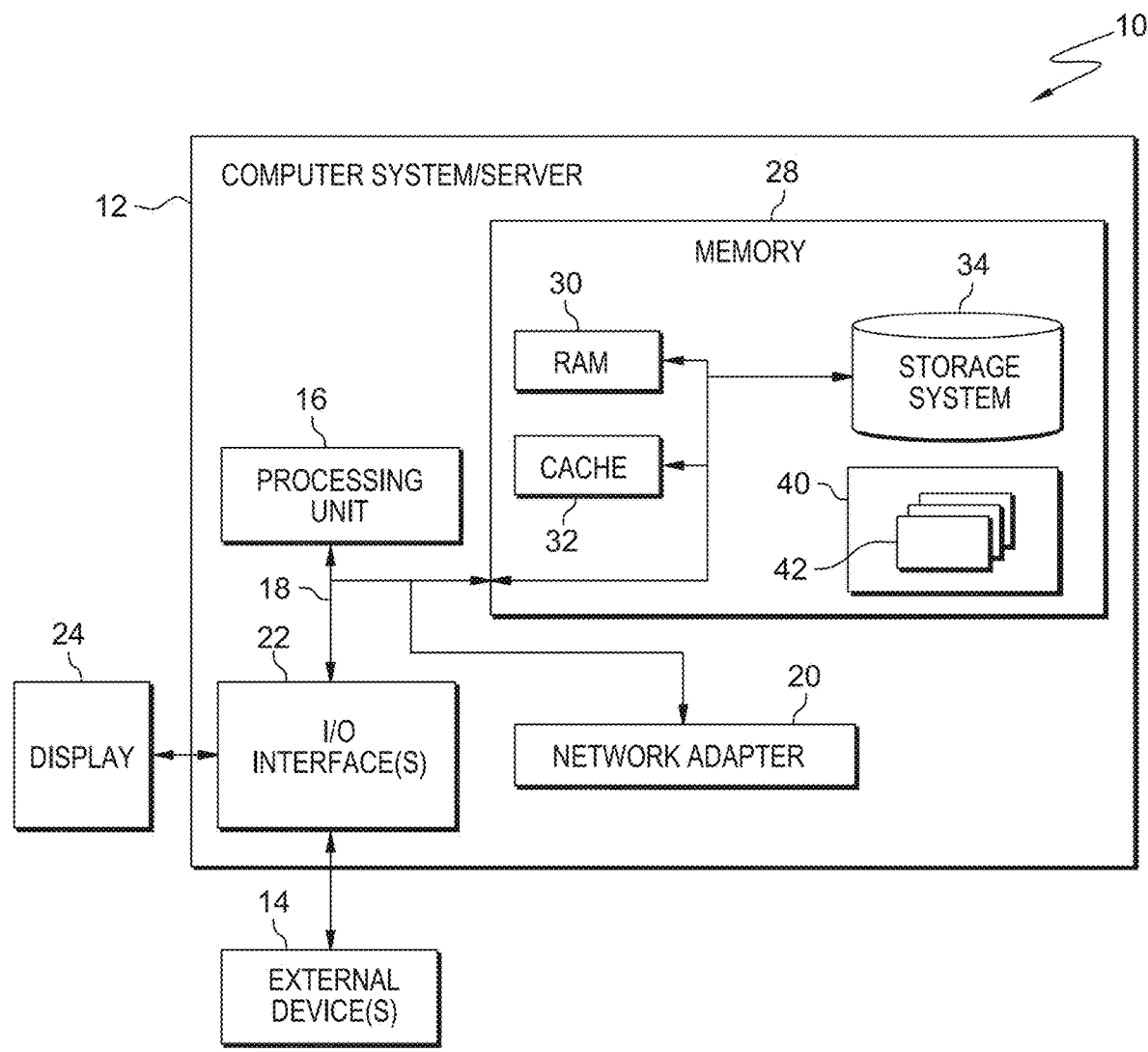
FIG. 2 depicts a block diagram depicting the internal and external components of the server and computing device of FIG. 1, in accordance with one embodiment of the present.

FIG. 2, a schematic of an example of a cloud computing node is shown. Cloud computing node 10 is only one example of a suitable cloud computing node and is not intended to suggest any limitation as to the scope of use or functionality of embodiments of the invention described herein. Regardless, cloud computing node 10 is capable of being implemented and/or performing any of the functionality set forth hereinabove.

In cloud computing node 10 there is a computer system/server 12, which is operational with numerous other general purpose or special purpose computing system environments or configurations. Examples of well-known computing systems, environments, and/or configurations that may be suitable for use with computer system/server 12 include, but are not limited to, personal computer systems, server computer systems, thin clients, thick clients, hand-held or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 12 may be described in the general context of computer system executable instructions, such as program modules, being executed by a computer system. Generally, program modules may include routines, programs, objects, components, logic, data structures, and so on that perform particular tasks or implement particular abstract data types. Computer system/server 12 may be practiced in distributed cloud computing environments where tasks are performed by remote processing devices that are linked through a communications network. In a distributed cloud computing environment, program modules may be located in both local and remote computer system storage media including memory storage devices.

FIG. 2, computer system/server 12 in cloud computing node 10 is shown in the form of a general-purpose computing device. The components of computer system/server 12 may include, but are not limited to, one or more processors or processing units 16, a system memory 28, and a bus 18 that couples various system components including system memory 28 to processor 16.

Bus 18 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system/server 12 typically includes a variety of computer system readable media. Such media may be any available media that is accessible by computer system/server 12, and it includes both volatile and non-volatile media, removable and non-removable media.

System memory 28 can include computer system readable media in the form of volatile memory, such as random access memory (RAM) 30 and/or cache memory 32. Computer system/server 12 may further include other removable/non-removable, volatile/non-volatile computer system storage media. By way of example only, storage system 34 can be provided for reading from and writing to a non removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 18 by one or more data media interfaces. As will be further depicted and described below, memory 28 may include at least one program product having a set (e.g., at least one) of program modules that are configured to carry out the functions of embodiments of the invention.

Program/utility 40, having a set (at least one) of program modules 42, may be stored in memory 28 by way of example, and not limitation, as well as an operating system, one or more application programs, other program modules, and program data. Each of the operating system, one or more application programs, other program modules, and program data or some combination thereof, may include an implementation of a networking environment. Program modules 42 generally carry out the functions and/or methodologies of embodiments of the invention as described herein.

Computer system/server 12 may also communicate with one or more external devices 14 such as a keyboard, a pointing device, a display 24, etc.; one or more devices that enable a user to interact with computer system/server 12; and/or any devices (e.g., network card, modem, etc.) that enable computer system/server 12 to communicate with one or more other computing devices. Such communication can occur via Input/Output (I/O) interfaces 22. Still yet, computer system/server 12 can communicate with one or more networks such as a local area network (LAN), a general wide area network (WAN), and/or a public network (e.g., the Internet) via network adapter 20. As depicted, network adapter 20 communicates with the other components of computer system/server 12 via bus 18. It should be understood that although not shown, other hardware and/or software components could be used in conjunction with computer system/server 12. Examples, include, but are not limited to: microcode, device drivers, redundant processing units, and external disk drive arrays, RAID systems, tape drives, and data archival storage systems, etc.

Figure 3:
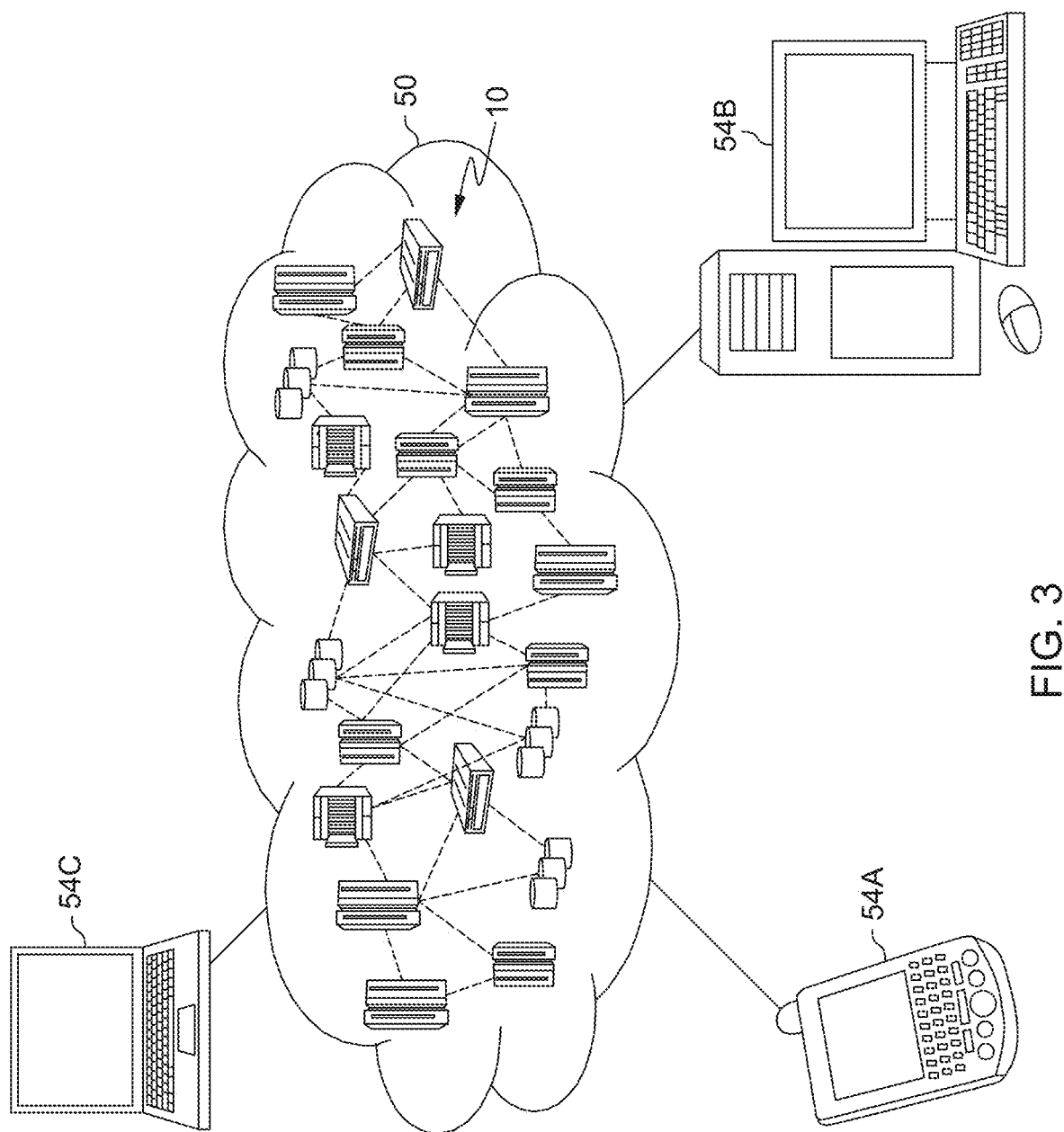
FIG. 3 depicts a cloud computing environment, in accordance with one embodiment of the present invention.

FIG. 3, illustrative cloud computing environment 50 is depicted. As shown, cloud computing environment 50 comprises one or more cloud computing nodes 10 with which local computing devices used by cloud consumers, such as, for example, personal digital assistant (PDA) or cellular telephone 54A, desktop computer 54B, laptop computer 54C may communicate. Nodes 10 may communicate with one another. They may be grouped (not shown) physically or virtually, in one or more networks, such as Private, Community, Public, or Hybrid clouds as described hereinabove, or a combination thereof. This allows cloud computing environment 50 to offer infrastructure, platforms and/or software as services for which a cloud consumer does not need to maintain resources on a local computing device. It is understood that the types of computing devices 54A-C shown in FIG. 2 are intended to be illustrative only and that computing nodes 10 and cloud computing environment 50 can communicate with any type of computerized device over any type of network and/or network addressable connection (e.g., using a web browser).

Referring back to FIG. 2, the Program/utility 40 may include one or more program modules 42 that generally carry out the functions and/or methodologies of embodiments of the invention as described herein. Specifically, the program modules 42 may analyze a building model, locate the frame members and the furniture, determine the interactions or interfacing between these members and/or furniture, determine if a conflict exists, identify the conflicting members and/or furniture, and provide potential solutions to the conflict and implement the solutions. Other functionalities of the program modules 42 are described further herein such that the program modules 42 are not limited to the functions described above. Moreover, it is noted that some of the modules 42 can be implemented within the infrastructure shown in FIGS. 1-3.

Figure 4:
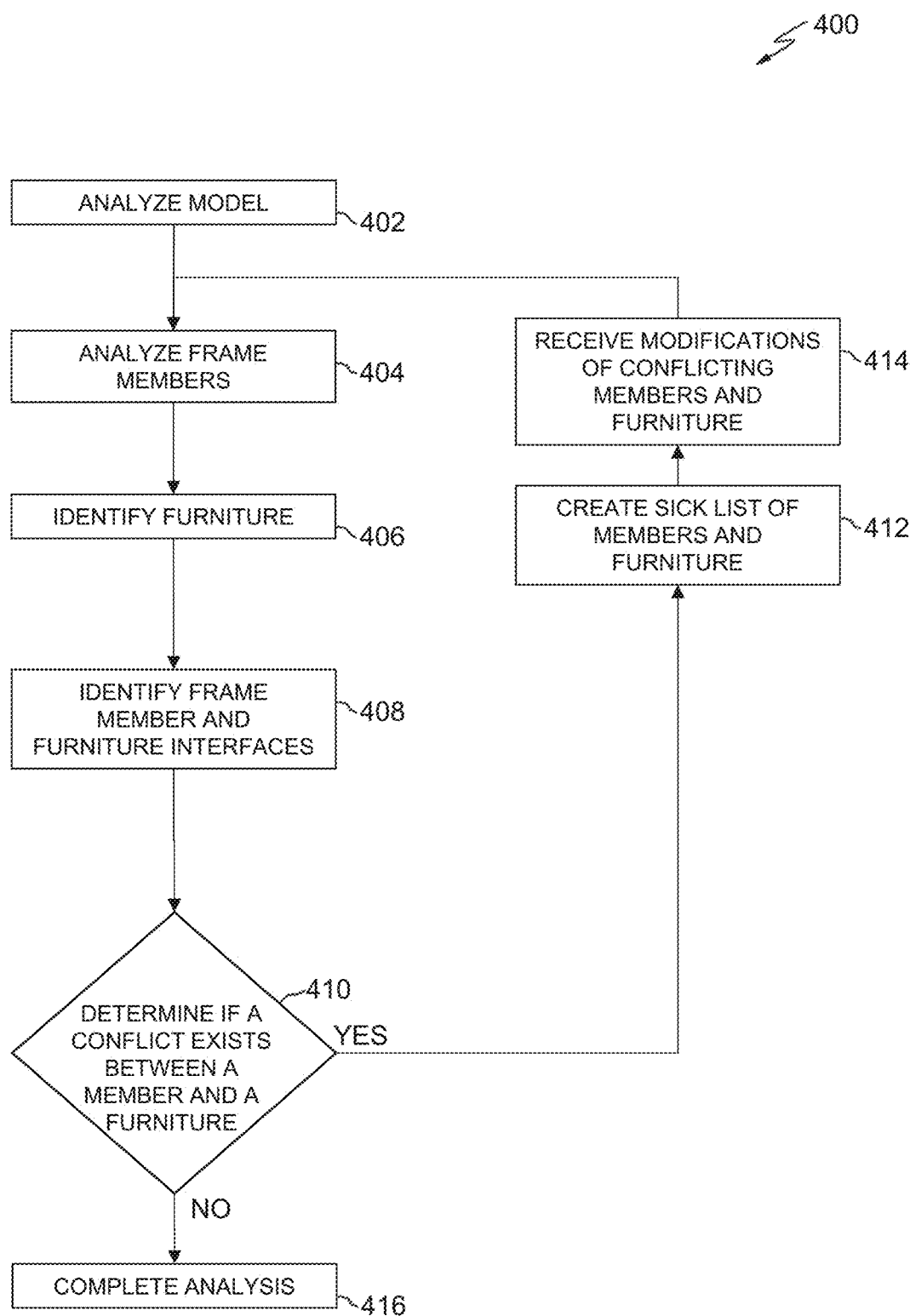
FIG. 4 depicts a flowchart of the operational steps of a method for determining the conflicts between the frame members and the plumbing system within the computing environment of FIG. 1, in accordance with one embodiment of the present invention.
Figure 5:
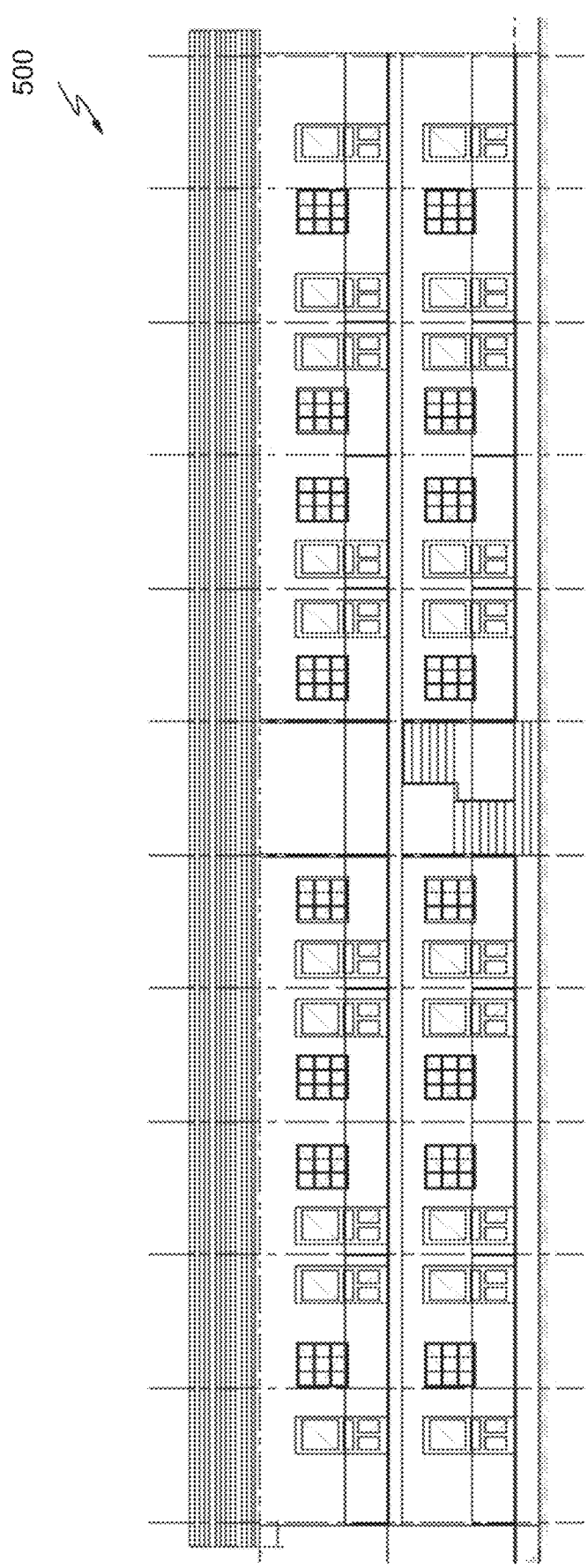
FIG. 5 depicts an architectural illustration of a front view of a structure, in accordance with one embodiment of the present invention.

FIG. 4 depicts flowchart 400 depicting a method according to the present invention. The method(s) and associated process(es) are now discussed, over the course of the following paragraphs, in accordance with one embodiment of the present invention.

In step 402, the conflict identification program 108 analyzes the model. In the analysis the conflict identification program 108 identifies the frame members and the furniture. Based on the model or image type, the conflict identification program 108 extracts the framing members and/or the structure of the building. This may include the identification of the assemblies of the frame (e.g. wall panel, roof truss, floor joist, and the like). In some embodiments the model has all the members individually generated, and the assemblies formed. In instances where the model does not have each individual member created, the conflict identification program 108 analyzes the model or images to determine the building layout, which surfaces are walls, floors, ceilings, and the like. Through the analysis of the layout of the building the conflict identification program 108 is able to determine the furniture requirements for the rooms or space within the building. For example, a room that would be a kitchen, bedroom, bathroom, living room, and the like. The analysis of the layout may also identify apertures (e.g. windows, doors) and other features of the building. This includes both external walls and internal walls.

In step 404, the conflict identification program 108 identifies the frame members and analyzes the properties of the frame members. The conflict identification program 108 extracts the necessary information related to each frame member. In some embodiments, the conflict identification program 108 identifies the position of the frame members relative to each other, the geospatial information of the frame members within the model, the physical properties of the frame members (e.g. cross section, thickness, material properties, etc.). The conflict identification program 108 may identify and correct internal conflicts within the members, or external conflicts between the members until a frame with no conflicts exists. In some embodiments, the conflict identification program 108 identifies the sheathing material applied to the frame. The sheathing material such as drywall or the like is identified for instances where the furniture interfaces with the sheathing material. For example, a shower head, faucet, sink, hook ups for washer dryer, etc.

In step 406, the conflict identification program 108 identifies the furniture. The conflict identification program 108 is able to extract the furniture which are constructed within the 3D model. Extracted through an analysis of the illustrations or drawings of the building and calculating the furniture layout, or the use of third party software to design and develop a furniture based on the overall building design and requirements. The conflict identification program 108 is able to overlay the furniture on the frame to create a complete integration of the frame and the furniture. The furniture are typically required to be secured to the frame members, and not just the sheathing material. Due to the requirement for the frame members to be positioned at the proper width based on the securement points for the fixture. The conflict identification program 108 analyzes the furniture to determine the mounting/securement points, the distances and measurements of the points.

In step 406, the conflict identification program 108 identifies the frame member and the furniture interfaces. Based on the building type, the building codes, the limitations set forth by either the conflict identification program 108, a third party, or a user, and other factors. The conflict identification program 108 establishes a set of required values based on the interfaces between the members and the furniture. These require values (and tolerances for appropriate ranges) are used to set a baseline in which the models' actual values are compared against. For example, the width of the frame members relative to the fixture mounting point width. Where a fixture is secured to a member via a bracket, the distance between the member and the fixture, the distance between the brackets. In some embodiments, the conflict identification program 108 identifies the members' orientation, location, and aspects in one direction. This direction isolates the members relative to the interface with the furniture to remove all unnecessary aspects or calculations to increase the processing. When the members are made from cold formed steel, the members are secured together through the use of fasteners are predetermined locations. The conflict identification program 108 identifies each of these fastening locations, as these locations are taken into account when there is an interface with the furniture. In some embodiments, where the furniture is part of the model, the global positioning/coordinates of the furniture in the X, Y, and Z axes are analyzed and identified.

In decision 410, the conflict identification program 108 determines if the frame members have any conflicts with the furniture. Based on an analysis of the actual measured values of the positioning of the frame members and furniture, an analysis of the actual measurements of the properties of the frame members and the furniture, and the structural requirements of the frame members and the requirements of the furniture. The conflict identification program 108 compares these actual values, to a set of required values to determine if a conflict exists. These properties are related to features of the members and furniture such as the length, height, width, thickness of material, orientation, position, cutouts, apertures, lips, flanges, Swedge, and the like. The cutouts need to be sized appropriately based on the size and number of the furniture which are passing through the members. The relative position between the members and the furniture when the fixture is affixed to a member for support (e.g. the length, size, and limitations of the bracket). The conflict identification program 108 may identify conflicts where there due to improper location of the individual members and their orientation, overlapping of the members with furniture, insufficient gap or distance, wrong positions of required studs, cuts and service holes in the members.

The measured actual values are compared to the required values. This comparison assists in confirming that the members and the furniture are all within the proper specifications. If the conflict identification program 108 determines that an actual value of any properties of the member or fixture are outside the predetermined tolerance range, the conflict identification program 108 creates the sick list and adds the identified member(s) or fixture (s) to the sick list.

In step 412, the conflict identification program 108 creates the sick list of the members which have issues. This list may be the identification of the members within the model as highlighted or identified from the other members. In some embodiments, the sick list is a list showing the actual values, the required values, and the differences between these two values (delta) and highlight the member data to alert a user.

In step 414, the conflict identification program 108 modifies the conflicting members or furniture. Through either an automated process or the selection of a user, the conflict identification program 108 is able to modify the conflicting members and furniture through either a modification of the properties of the material, making alterations to the members, or repositioning the member, so that the member(s) fall within the tolerance range set for each member. In some embodiments, this may require performing additional modifications to the members if the modification results in other members becoming conflicted due to the change. These modifications which are made are designed to result in the least number of new conflicts being created, preferably the modification which results in no new conflicts being created.

In some embodiments, the conflict identification program 108 modifies the furniture first and the frame members second.

Figure 6:
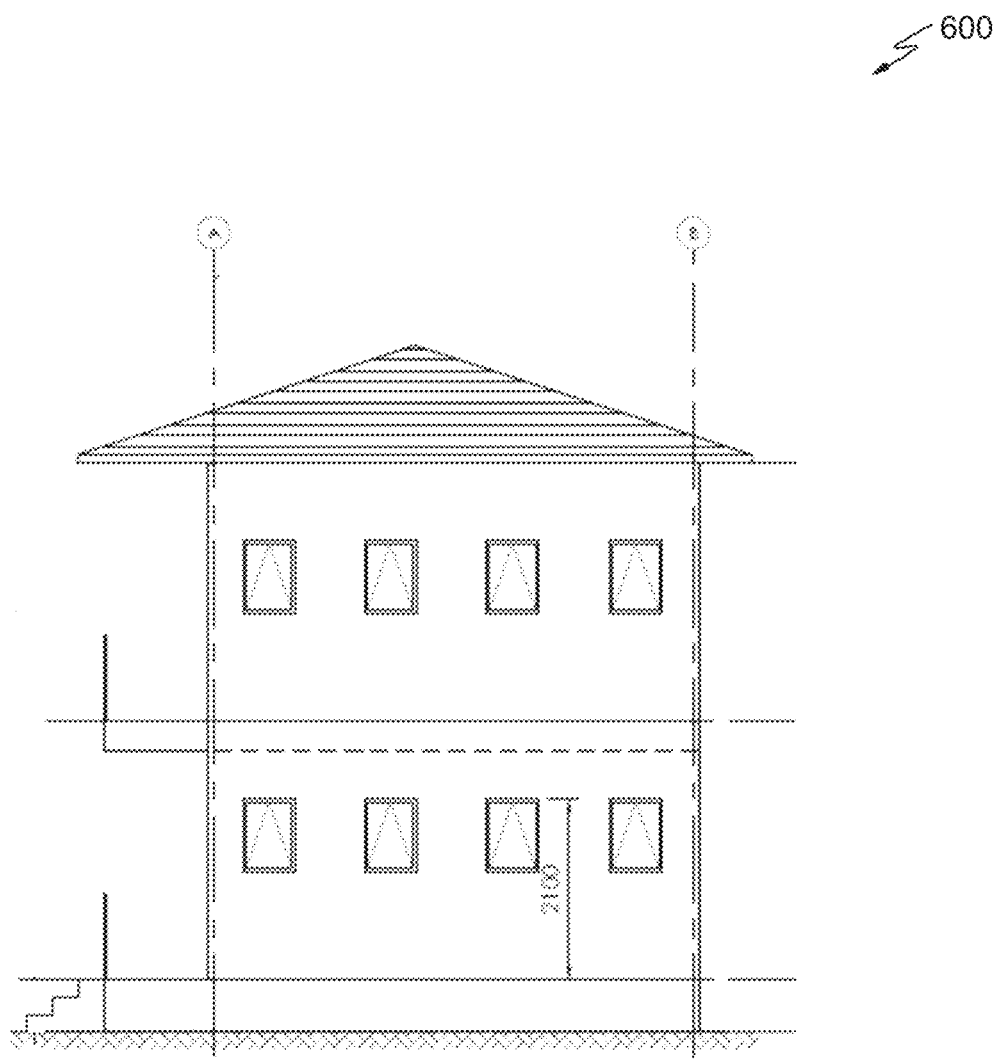
FIG. 6 depicts an architectural illustration of a profile view of a structure, in accordance with one embodiment of the present invention.
Figure 7A:
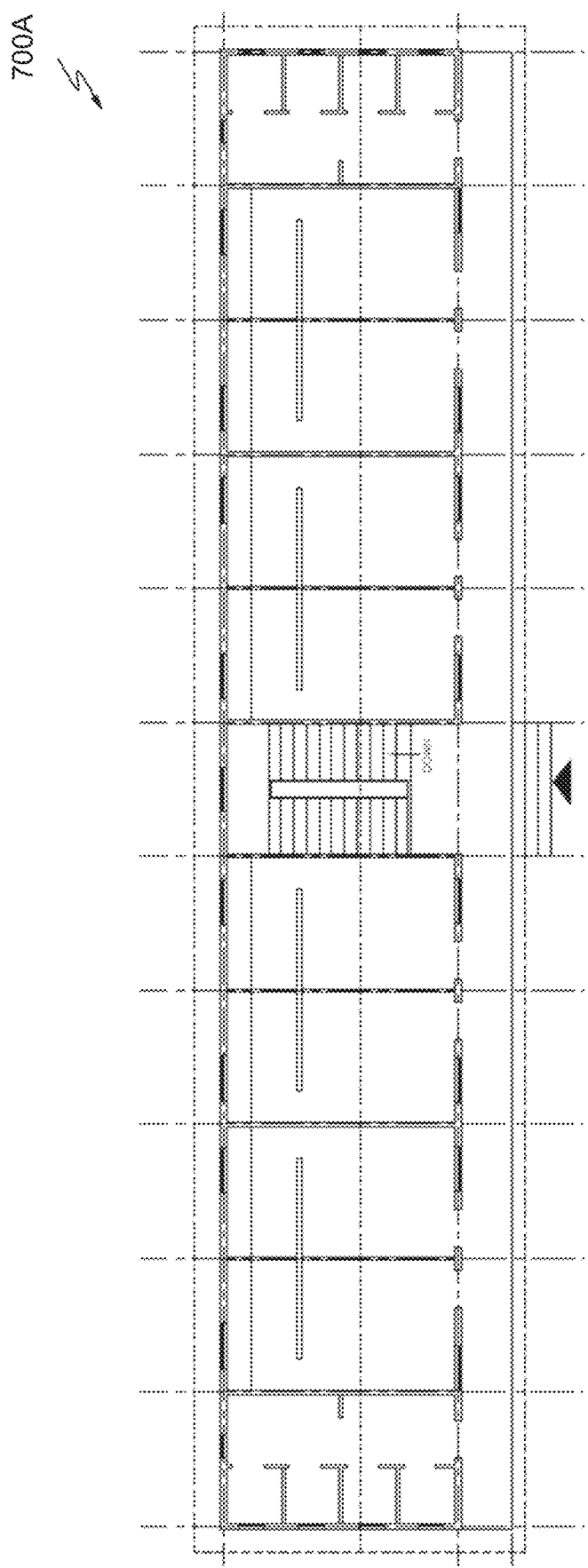
FIG. 7A depict an architectural illustration of a finished floor layout for a structure, in accordance with one embodiment of the present invention.
Figure 7B:
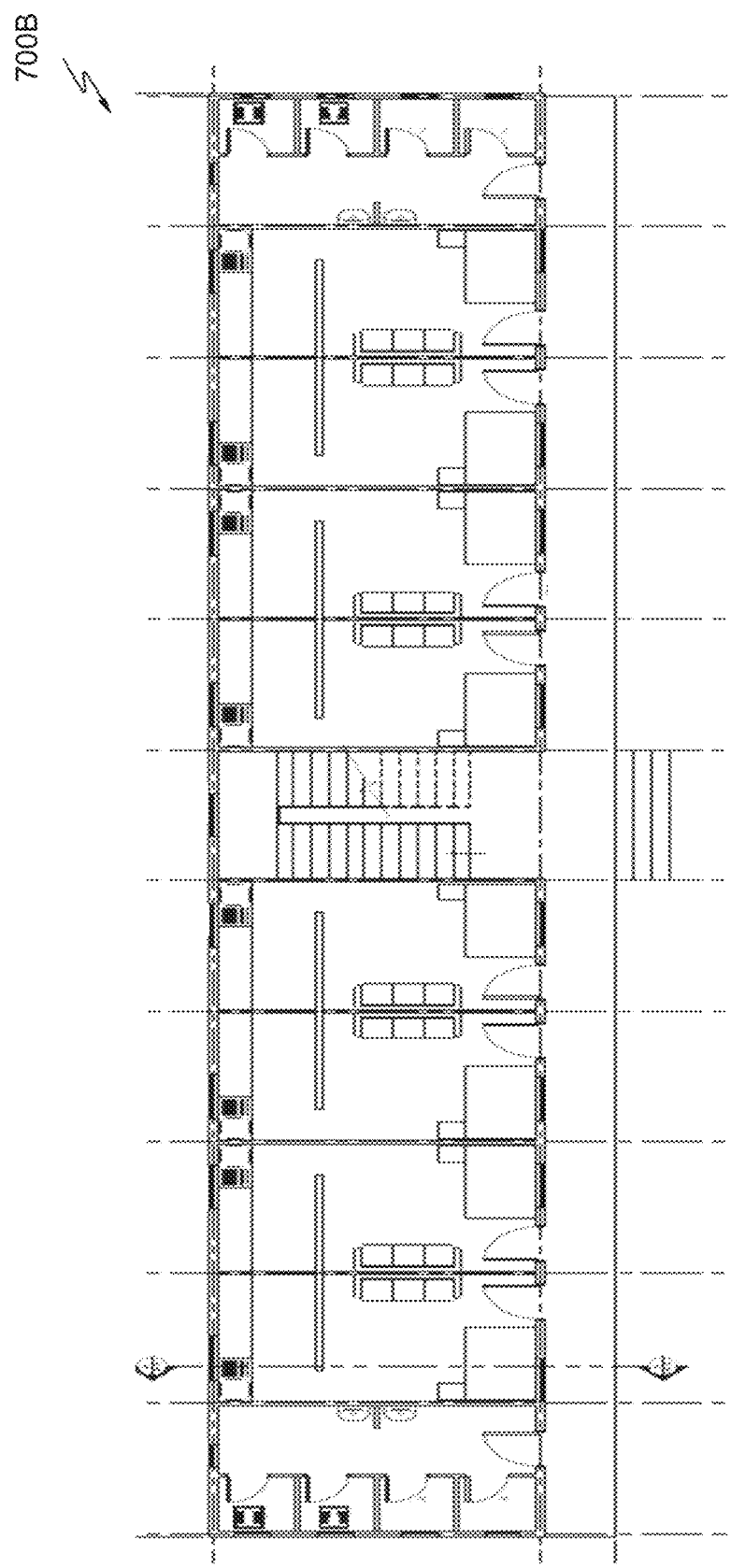
FIG. 7B depict an architectural illustration of a finished floor layout for a structure, in accordance with one embodiment of the present invention.

FIGS. 5, 6, 7A, and 7B depict various architectural illustration of a structure, in accordance with one embodiment of the present invention. The conflict identification program 108 may use these and other architectural illustrations to determine the layout of the building and analyses them to determine the layout of the plumbing system based on the room layouts. For example, a kitchen requires certain plumbing design features, a bathroom requires other design features, a sewage system, heating system, waste removal system, and the like all require different designs based on the building size, design, layout, and features. A single-family home would have a different set of requirements compared to a multi floor apartment building In FIG. 5, the exterior features of the building are shown and identified. The conflict identification program 108 is able to determine the location of the apertures so that the plumbing system does not interfere with these. In FIG. 6, the side profile of a building is shown to determine the number of floors the plumbing system needs to traverse. FIGS. 7A and 7B depicts views of a floor plan both with the placement of furniture, appliances, doors, windows, and other fixtures within the interior space, and a floor plan without these parts. This assists the conflict identification program to identify interior and exterior walls, each room layout and purpose, and other features of the building to assist in establishing a layout of the plumbing system which has minimal conflicts, but meets the necessary requirements for the space in terms of piping location exits and entrances, valves, shutoffs, and the like. The conflict identification program 108 is able to detected interior and exterior walls, and determine if a plumbing system is appropriate to place within the exterior walls based on the environment where the building is to be built, the sheathing material and potential freezing possibility of the pipes. Through the analysis of the building design, the conflict identification program 108 is able to establish a set of limits and requirements which the members and furniture are judged by to determine the conflicts.

Figure 8:
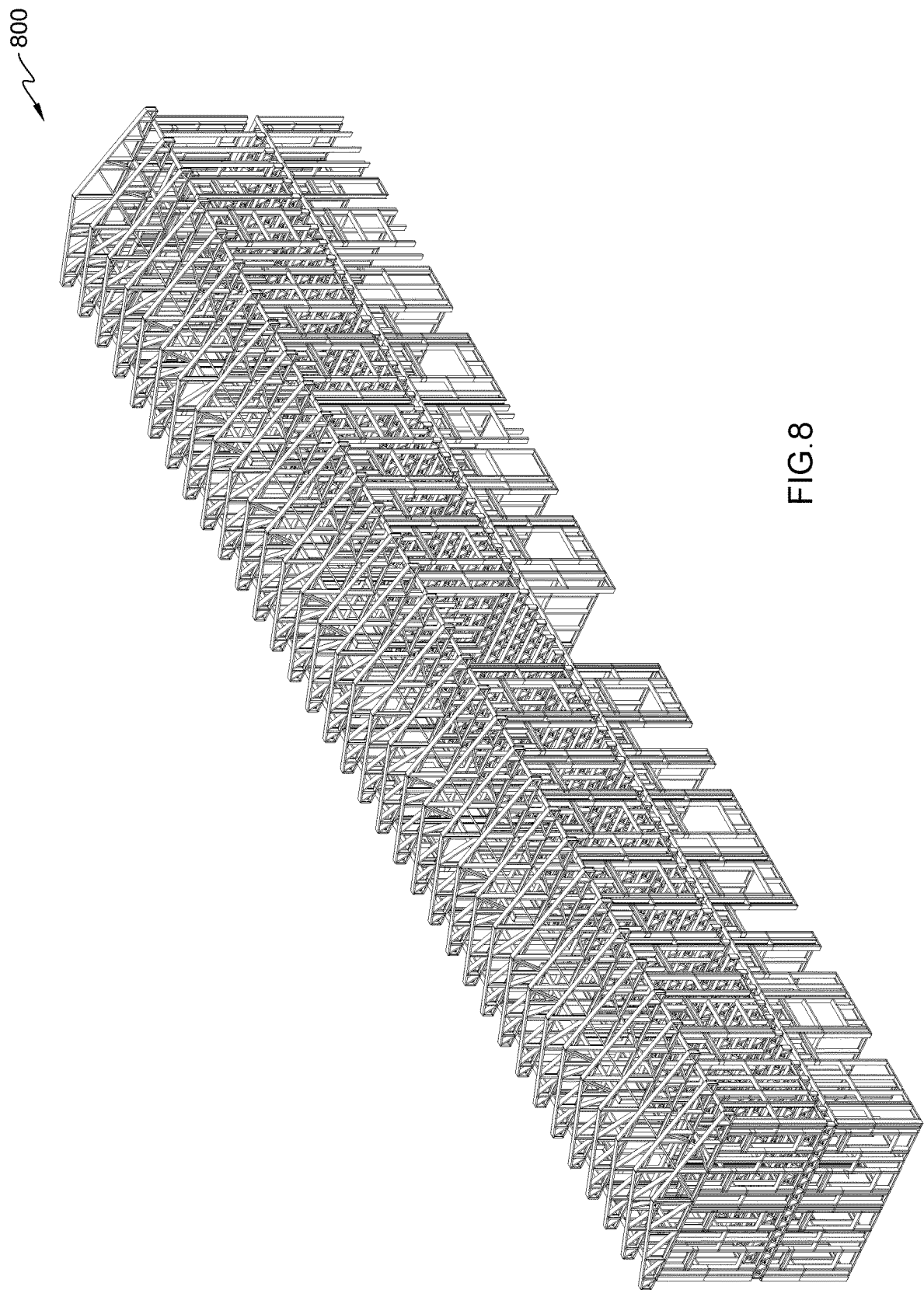
FIG. 8 depicts a model of a frame of a structure, in accordance with one embodiment of the present invention.

FIG. 8 depicts a model 800 of a frame of a structure, in accordance with one embodiment of the present invention. This model provides all of the framing members including the walls, floors, and roofs. The conflict identification program 108 is able to take either the illustrations or model(s) and perform the analysis identified in FIG. 4, as the program is able to detect the frame members and frame assemblies. In the depicted embodiment, the model depicts the structural framing members, with all the connection points for the frame members determined. This model would be analyzed for each structural member to determine any conflicts. If a conflict is found, that member may be highlighted or identified in a different color to allow easy visual identifies for the user to locate the conflicting member.

Figure 9:
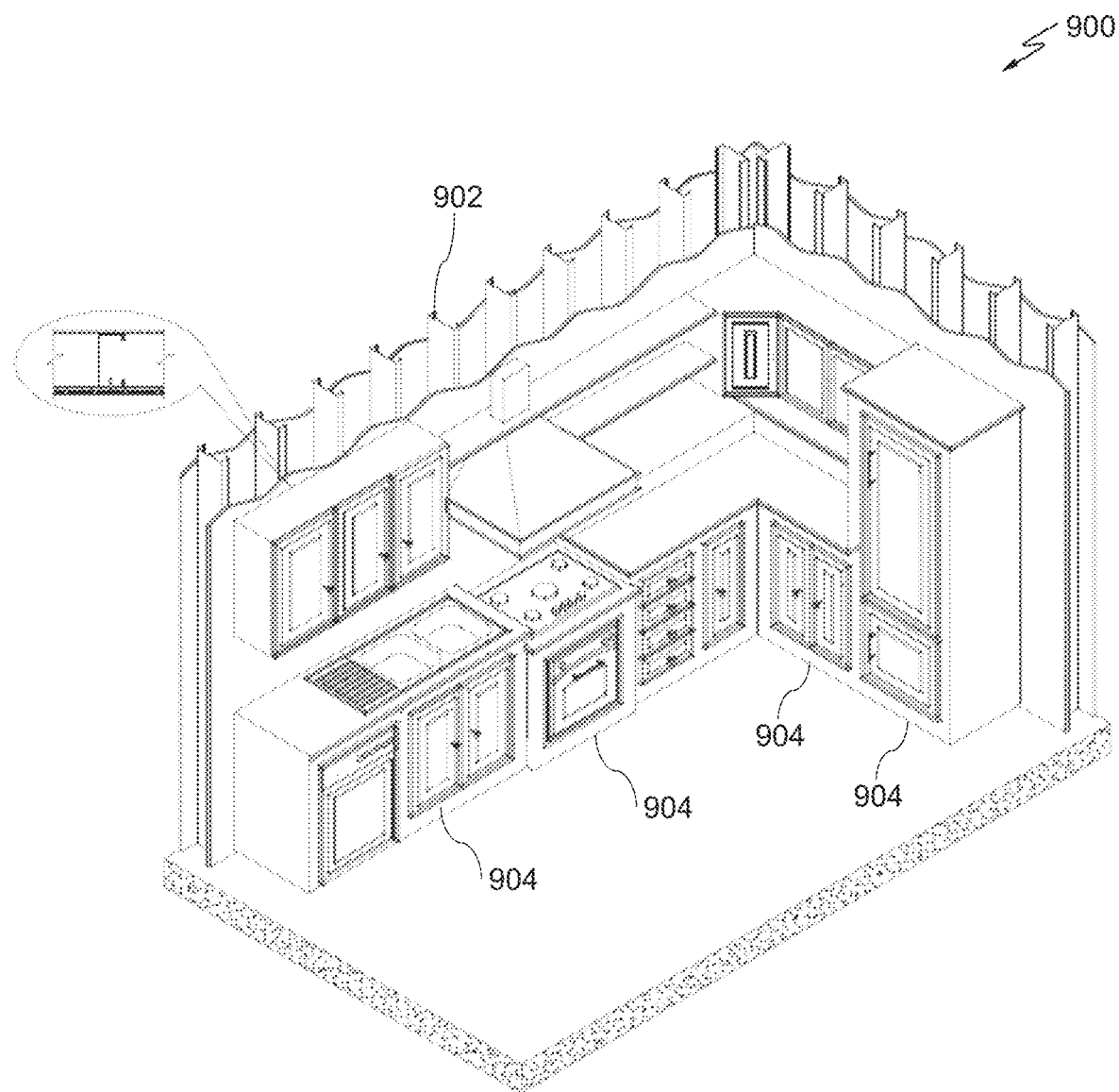
FIG. 9 depicts an illustration of furniture within a frame structure, in accordance with one embodiment of the present invention.
Figure 10:
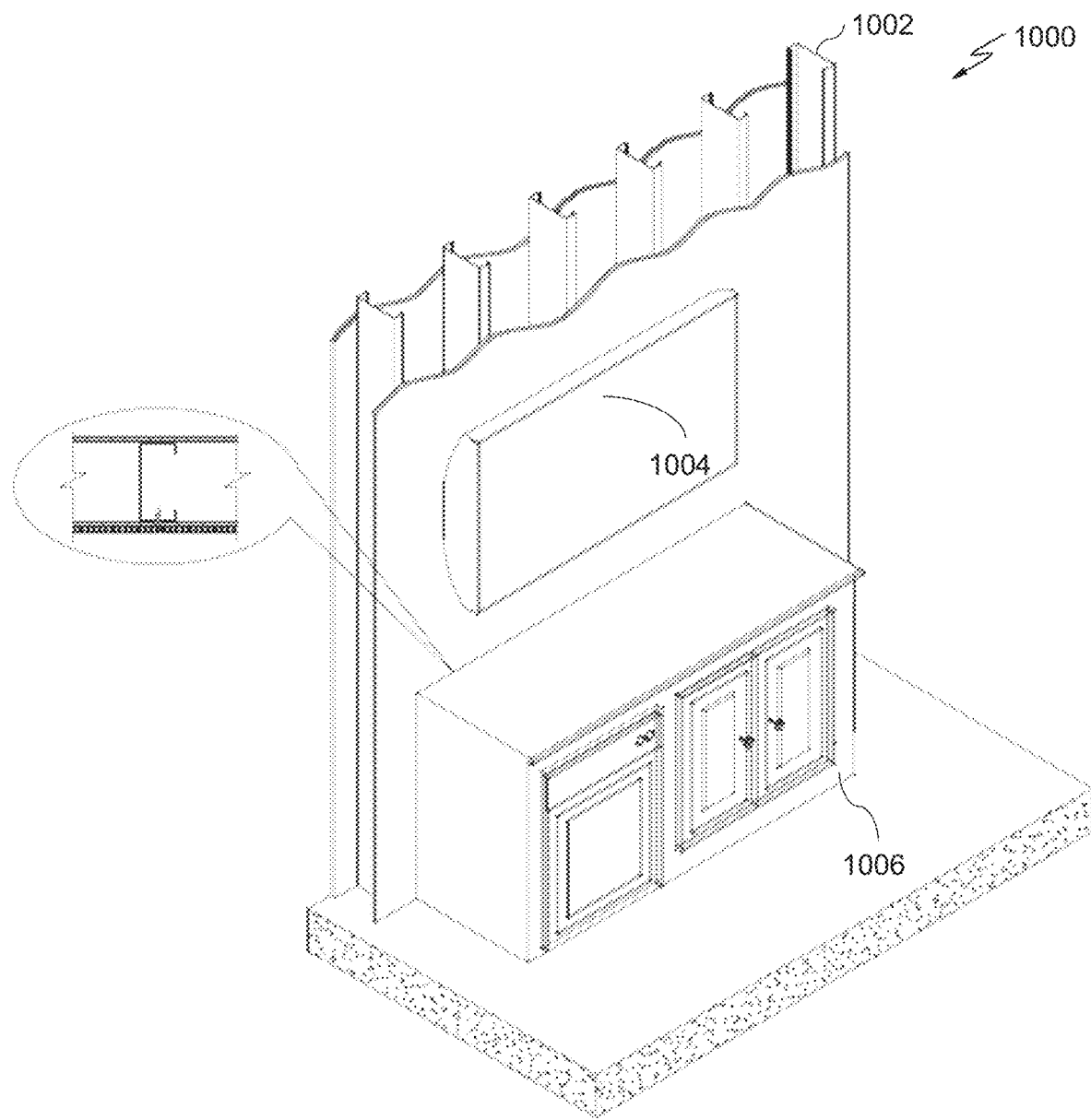
FIG. 10 depicts an illustration of furniture within a frame structure, in accordance with one embodiment of the present invention.
Figure 11:
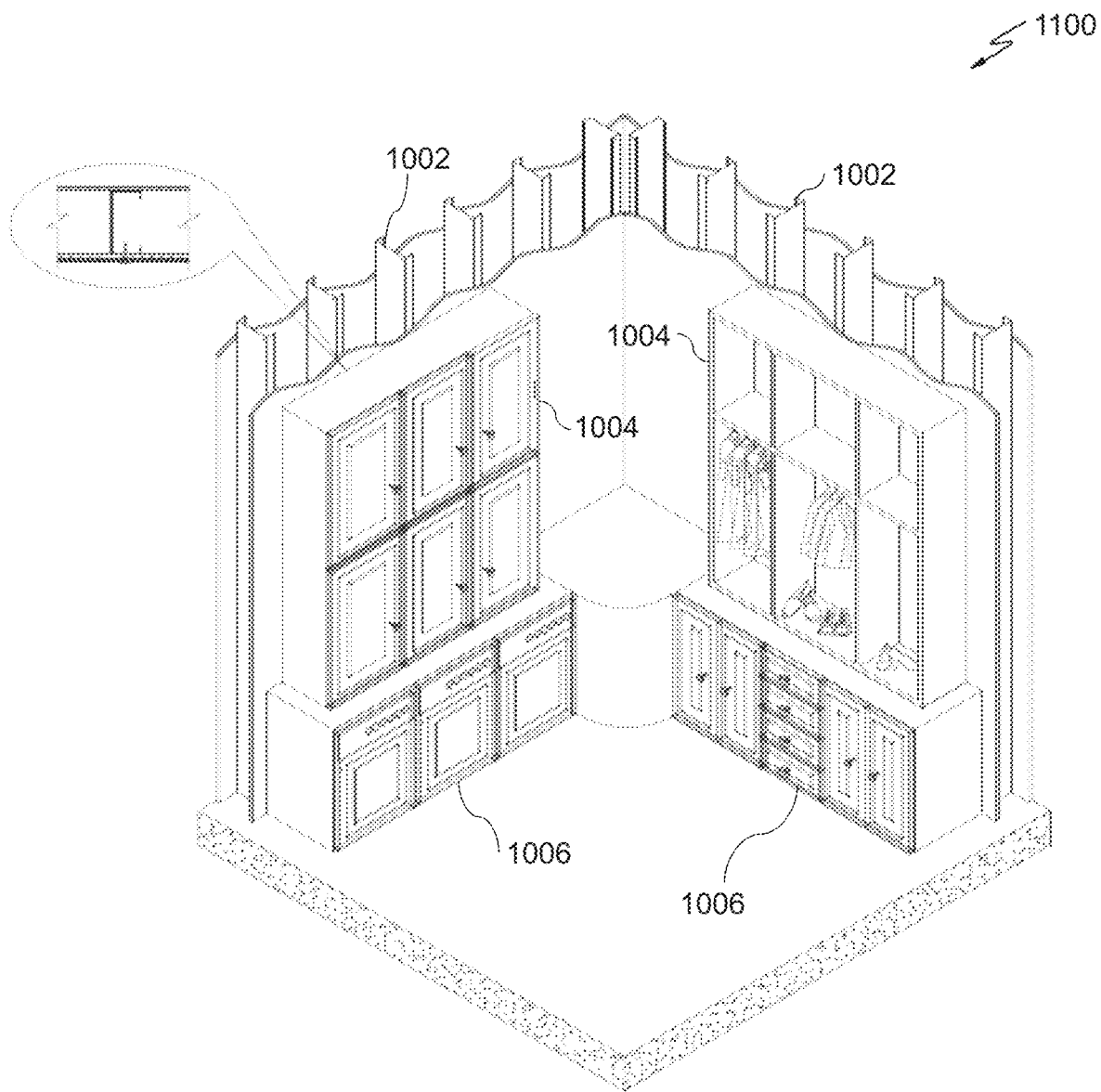
FIG. 11 depicts an illustration of furniture within a frame structure, in accordance with one embodiment of the present invention.

FIGS. 9-11 depict various embodiments of furniture integrated into a building model, in accordance with an embodiment of the present invention. In FIG. 9, a typical kitchen layout is shown with various pieces of furniture 904 positioned against a wall with frame members 902 positioned in the wall. The various pieces of furniture 904 are secured to the frame members which span the width of the piece of furniture. The number of fasteners, the position of the fasteners is based on the height of the floor of the furniture, the weight of the furniture, and the mounting type of the furniture. FIG. 10 depicted a television 1004 secured to a wall and a cabinet 1006 secured to a wall. The mounting of the television 1004 is based on the predetermined mounting type and features. The positioning of the frame members 1002 depicts the type of fasteners and mounting type which is used. In FIG. 11, cabinets 1004 are resting on cabinets 1006, wherein the type of fasteners required and the positioning of the cabinets 1004 and 1006 relative to the frame members 1002 is analyzed and processed to determine the type and location of the fasteners.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punchcards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or mechanical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, fire joists, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein that are believed as maybe being new, this understanding, as indicated by use of the term "present invention," is tentative and provisional and subject to change over the course of patent prosecution as relevant information is developed and as the claims are potentially amended.

The foregoing descriptions of various embodiments have been presented only for purposes of illustration and description. They are not intended to be exhaustive or to limit the present invention to the forms disclosed. Accordingly, many modifications and variations of the present invention are possible in light of the above teachings will be apparent to practitioners skilled in the art. Additionally, the above disclosure is not intended to limit the present invention. In the specification and claims the term "comprising" shall be understood to have a broad meaning similar to the term "including" and will be understood to imply the inclusion of a stated integer or step or group of integers or steps but not the exclusion of any other integer or step or group of integers or steps. This definition also applies to variations on the term "comprising" such as "comprise" and "comprises".

Although various representative embodiments of this invention have been described above with a certain degree of particularity, those skilled in the art could make numerous alterations to the disclosed embodiments without departing from the spirit or scope of the inventive subject matter set forth in the specification and claims. Joinder references (e.g. attached, adhered, joined) are to be construed broadly and may include intermediate members between a connection of elements and relative movement between elements. As such, joinder references do not necessarily infer that two elements are directly connected and in fixed relation to each other. Moreover, network connection references are to be construed broadly and may include intermediate members or devices between network connections of elements. As such, network connection references do not necessarily infer that two elements are in direct communication with each other. In some instances, in methodologies directly or indirectly set forth herein, various steps and operations are described in one possible order of operation, but those skilled in the art will recognize that steps and operations may be rearranged, replaced or eliminated without necessarily departing from the spirit and scope of the present invention. It is intended that all matter contained in the above description or shown in the accompanying drawings shall be interpreted as illustrative only and not limiting. Changes in detail or structure may be made without departing from the spirit of the invention as defined in the appended claims.

Although the present invention has been described with reference to the embodiments outlined above, various alternatives, modifications, variations, improvements and/or substantial equivalents, whether known or that are or may be presently foreseen, may become apparent to those having at least ordinary skill in the art. Listing the steps of a method in a certain order does not constitute any limitation on the order of the steps of the method. Accordingly, the embodiments of the invention set forth above are intended to be illustrative, not limiting. Persons skilled in the art will recognize that changes may be made in form and detail without departing from the spirit and scope of the invention. Therefore, the invention is intended to embrace all known or earlier developed alternatives, modifications, variations, improvements and/or substantial equivalents.

What is claimed is:

1. A computer implemented method for determining and conforming integration of fixed furniture within a building are safe before construction process, comprising:
    accessing, by at least one processor, a model, wherein the model is comprised of frame members;
    overlaying the fixed furniture on the frame members to create a complete integration of the frame and the fixed furniture; wherein the furniture comprises a plurality of components interface with frame members;
    identifying, by at least one processor, components and frame members, wherein the components are positioned within the model and interface with frame members, wherein the components interface with a set of frame members associated with a floor and a set of frame members associated with a wall;
    analyzing, by at least one processor, at least one instance where the component interfaces with at least one of the frame members;
    calculating, by at least one processor, an actual location of the component relative to the frame members based on measurements;
    comparing, by at least one processor, the actual location of the component relative to the frame members to a required location; wherein the required location is based on a set of properties of the frame and determining if the actual location is within a tolerance of the required location; wherein the tolerance of the required location is based on the construction requirement of the building and properties of the furniture; wherein the properties of the furniture include dimension, orientation and weight; wherein comparing step further include
        detecting a required set of fastening locations for the component based on the set of properties of the frame; and
        analyzing the set required of fastening locations and the interfacing of the component and the frame members to identify conflict; wherein conflict include improper location of the individual frame members and their orientation, overlapping of the frame members with components of the furniture, insufficient gap and wrong positions of required studs, cuts and service holes in the frame members;
    generating, by at least one processor, a list of interfaces which the actual location is outside the tolerance of the required locations; and
    modifying, by at least one processor, the actual location of the component relative to the frame members based on the list to ensure the integration of fixed furniture within the building are proper and safe.

2. The computer implemented method of claim 1, further comprising, analyzing, by one or more processors, the required set of fastening locations based on a component type.

3. The computer implemented method of claim 1, further comprising, analyzing, by one or more processors, the required set of fastening locations based on a component position relative to the floor.

4. The computer implemented method of claim 1, further comprising, analyzing, by one or more processors, the required set of fastening locations based on a component interface with another component.

5. The computer implemented method of claim 1, further comprising, comparing, by at least one processor, the set of fastening locations and the interfacing of the component and the frame members.

6. The computer implemented method of claim 1, further comprising, modifying, by one or more processors, the fastening locations based on the interface, while maintain the required value of fastener locations.

7. A computer program product for determining and conforming integration of fixed furniture within a building are safe before construction process, comprising:
a computer readable non-transitory storage medium having program instructions embodied therewith, the program instructions executable by a computing device to cause the computing device to:
program instructions to access a model, wherein the model is comprised of frame members;
program instructions to overlay the fixed furniture on the frame members to create a complete integration of the frame and the fixed furniture; wherein the furniture comprises a plurality of components interface with frame members;
program instructions to identify components and frame members, wherein the components are positioned within the model and interface with frame members, wherein the components interface with a set of frame members associated with a floor and a set of frame members associated with a wall;
program instructions to analyze at least one instance where the component interfaces with at least one of the frame members;
program instructions to calculate an actual location of the component relative to the frame members based on measurements;
program instructions to compare the actual location of the component relative to the frame members to a required location; wherein the required location is based on a set of properties of the frame and determining if the actual location is within a tolerance of the required location; wherein the tolerance of the required location is based on the construction requirement of the building and properties of the furniture; wherein the properties of the furniture include dimension, orientation and weight;
wherein comparing further include
detecting a required set of fastening locations for the component based on the set of properties of the frame; and
analyzing the set required of fastening locations and the interfacing of the component and the frame members to identify conflict; wherein conflict include improper location of the individual frame members and their orientation, overlapping of the frame members with components of the furniture, insufficient gap and wrong positions of required studs, cuts and service holes in the frame members;
program instructions to generate a list of interfaces which the actual location is outside the tolerance of the required locations; and
program instructions to manipulate modify the actual location of the component relative to the frame members based on the list to ensure the integration of fixed furniture within the building are proper and safe.

8. The computer program product of claim 7, further comprising, program instructions to analyze the required set of fastening locations based on a component type.

9. The computer program product of claim 7, further comprising, program instructions to analyze the required set of fastening locations based on a component position relative to the floor.

10. The computer program product of claim 7, further comprising, program instructions to analyze the required set of fastening locations based on a component interface with another component.

11. The computer program product of claim 7, further comprising, program instructions to compare the set of fastening locations and the interfacing of the component and the frame members.

12. The computer program product of claim 7, further comprising, program instructions to manipulate the data associated with the fastening locations based on the interface, while maintain the required value of fastener locations.

13. A system for determining and conforming integration of fixed furniture within a building are safe before construction process, comprising:
a CPU, a computer readable memory and a computer readable non-transitory storage medium associated with a computing device;
program instructions to access a model, wherein the model is comprised of frame members;
program instructions to overlay the fixed furniture on the frame members to create a complete integration of the frame and the fixed furniture; wherein the furniture comprises a plurality of components interface with frame members;
program instructions to identify components and frame members, wherein the components are positioned within the model and interface with frame members, wherein the components interface with a set of frame members associated with a floor and a set of frame members associated with a wall;
program instructions to analyze at least one instance where the component interfaces with at least one of the frame members;
program instructions to calculate an actual location of the component relative to the frame members based on measurements;
program instructions to compare the actual location of the component relative to the frame members to a required location; wherein the required location is based on a set of properties of the frame and determining if the actual location is within a tolerance of the required location; wherein the tolerance of the required location is based on the construction requirement of the building and properties of the furniture; wherein the properties of the furniture include dimension, orientation and weight;
wherein comparing further include
detecting a required set of fastening locations for the component based on the set of properties of the frame; and
analyzing the set required of fastening locations and the interfacing of the component and the frame members to identify conflict; wherein conflict include improper location of the individual frame members and their orientation, overlapping of the frame members with components of the furniture, insufficient gap and wrong positions of required studs, cuts and service holes in the frame members;
program instructions to generate a list of interfaces which the actual location is outside the tolerance of the required locations; and
program instructions to modify the actual location of the component relative to the frame members based on the list to ensure the integration of fixed furniture within the building are proper and safe.

14. The system of claim 13, further comprising, program instructions to analyze the required set of fastening locations based on a component type.

15. The system of claim 13, further comprising, program instructions to analyze the required set of fastening locations based on a component position relative to a floor.

16. The system of claim 13, further comprising, program instructions to compare the set of fastening locations and the interfacing of the component and the frame members.

17. The system of claim 13, further comprising, program instructions to manipulate the data associated with the fastening locations based on the interface, while maintain the required value of fastener locations.

* * * * *